(12) United States Patent
Noy

(10) Patent No.: US 9,750,141 B2
(45) Date of Patent: Aug. 29, 2017

(54) PRINTING HIGH ASPECT RATIO PATTERNS

(71) Applicant: UTILIGHT LTD, Yavne (IL)

(72) Inventor: Amir Noy, Kfar Mordechai (IL)

(*) Notice: Subject to any disclaimer, the term of this patent is extended or adjusted under 35 U.S.C. 154(b) by 0 days.

(21) Appl. No.: 15/122,922

(22) PCT Filed: Mar. 11, 2015

(86) PCT No.: PCT/IL2015/000013
§ 371 (c)(1),
(2) Date: Aug. 31, 2016

(87) PCT Pub. No.: WO2015/140775
PCT Pub. Date: Sep. 24, 2015

(65) Prior Publication Data
US 2017/0071062 A1    Mar. 9, 2017

Related U.S. Application Data

(60) Provisional application No. 61/955,374, filed on Mar. 19, 2014.

(51) Int. Cl.
| | |
|---|---|
| H05K 3/12 | (2006.01) |
| C09D 17/00 | (2006.01) |
| B41M 5/26 | (2006.01) |
| H05K 1/09 | (2006.01) |
| H05K 1/02 | (2006.01) |
| B41M 3/00 | (2006.01) |

(52) U.S. Cl.
CPC .............. *H05K 3/12* (2013.01); *B41M 5/26* (2013.01); *C09D 17/00* (2013.01); *H05K 1/0271* (2013.01); *H05K 1/095* (2013.01); *B41M 3/008* (2013.01); *H05K 1/0265* (2013.01); *H05K 2201/09736* (2013.01); *H05K 2203/107* (2013.01); *H05K 2203/1476* (2013.01)

(58) Field of Classification Search
CPC .. B05D 1/36; B05D 1/38; B41M 5/40; B41M 7/0054; C09D 17/00; H05K 3/12; H05K 3/10; H05K 3/1241; H05K 3/125; H05K 3/1266; H05K 3/1275
See application file for complete search history.

(56) References Cited

U.S. PATENT DOCUMENTS

| | | | |
|---|---|---|---|
| 5,362,513 A | 11/1994 | Shimada et al. | |
| 7,765,949 B2 * | 8/2010 | Fork | B29C 47/026 |
| | | | 118/315 |

(Continued)

FOREIGN PATENT DOCUMENTS

DE        2231614 A1    1/1974

*Primary Examiner* — Huan Tran
(74) *Attorney, Agent, or Firm* — Smith Tempel Blaha LLC; Gregory Scott Smith

(57) ABSTRACT

Described are an apparatus and a method for printing a high aspect ratio and/or specific vertical geometry pattern. The apparatus operates in a multi-pass printing mode and includes one or more paste dispensing mechanism configured to dispense a high viscosity paste to form a pattern on a substrate. At least one paste dispensing mechanism is configured to dispense the paste to a segment of the pattern printed at an earlier pass. The paste is dispensed to the relevant segment of the pattern earlier printed before the paste printed at the earlier made pass is dry or what is termed "wet-on-wet" printing.

32 Claims, 3 Drawing Sheets

(56) References Cited

U.S. PATENT DOCUMENTS

| | | |
|---|---|---|
| 2001/0029665 A1 | 10/2001 | HJashimoto et al. |
| 2007/0110836 A1* | 5/2007 | Fork .................... B29C 47/026 425/133.5 |
| 2009/0104383 A1 | 4/2009 | Terao et al. |
| 2010/0252105 A1 | 10/2010 | Fork et al. |
| 2011/0151665 A1* | 6/2011 | Gothati ................. H05K 3/125 438/660 |
| 2013/0176699 A1 | 7/2013 | Tonchev et al. |

* cited by examiner

PRINTING HIGH ASPECT RATIO PATTERNS

TECHNOLOGY FIELD

The apparatus and method relate to the field of printed electronics and in particular to printing high aspect ratio patterns of conductors and components.

BACKGROUND

Printed electronics is a novel recently developed electronics production method. It is a relatively low cost production method allowing flexible placement of passive and active electronic components including resistor, capacitors, inductors and electrical current conductors or simply conductors. Different materials in paste form are used to vary properties such as for example resistance, of the printed conductors and printed components.

One of the primary printing methods for producing conductive patterns on different types of substrates, particularly for features larger than about 100 microns, is screen printing. In screen printing a paste is squeezed through a stencil bearing the desired pattern. When conductive patterns are printed the paste can contain metal particles, such as silver and copper particles or organic conductive materials. Such pastes are usually applied to a substrate to form a patterned layer. The patterned layer then can be dried and transferred to another carrier or fired to remove the organic and inorganic solvents. Some of the difficulties encountered by screen printing include a poor ability to form high-aspect ratio patterns and in particular conductor lines. To get a desired cross section the conductors are increased in their width. Reduction of width of a printed conductor could enhance the density of the electronic circuits packaging, it also increases the conductor resistance and limits current carrying capability in fine conductors.

Glossary

Aspect ratio—as used in the current disclosure aspect ratio means a ratio between the height (h) of a printed feature to the width (w) or diameter (d) of the printed feature. High aspect ratio means that the printed pattern could have an aspect ratio of more than 0.5, 1.0, 2.0, 5.0 or more.

Vertical geometry pattern—as used in the current disclosure vertical geometry pattern means a printed pattern extending from the surface of the substrate in a direction generally perpendicular to the substrate surface. Vertical geometry pattern can also be described for "point like" patterns in terms of geometric 3D shape e.g. cube, cylinder, cone, pyramid etc. or for line patterns in terms of cross section (trapezoidal, rectangular, triangular etc.).

BRIEF SUMMARY

Described are an apparatus and a method for printing a high aspect ratio and/or specific vertical geometry pattern. The apparatus operates in a multi-pass printing mode and includes a paste dispensing mechanism configured to dispense a high viscosity paste to form in a first printing pass a pattern on a substrate and at least one additional paste dispensing mechanism configured to dispense on the same substrate an identical or a different paste to at least a segment of the pattern printed at the first pass such as to change in a second, usually non-contact printing pass the thickness of the segment of the pattern printed at the first pass. The paste dispensing mechanism configured to dispense the paste to a segment of the pattern printed at the first pass dispenses the paste to the relevant segment of the pattern earlier printed before the paste printed at the first pass is dry or what is termed "wet-on-wet" printing. In some examples, the apparatus could include more than two paste dispensing mechanisms with each of the mechanisms configured to dispense the same or a different paste.

The pastes dispensed or printed at different printing passes feature a viscosity sufficient to support minimal slumping between layers of pastes deposited wet-on-wet at different passes. Printed tests conducted by the author of the disclosure show that layers of paste deposited or printed at different passes feature good adhesion between themselves after drying/firing. Non-contact printing techniques support printing on "tacky" surfaces with poor adhesion.

Dispensing the paste and printing the pattern "wet-on-wet" facilitates accurate placement of the second and additional paste layers, since thermal processing of the printed layer, for example drying of the paste, would inevitably generate printed pattern distortions and complicate the second printed layer registration. The wet-on-wet printing process is free of this drawback.

The apparatus also includes one or more printing devices. The printing devices could print according to different printing techniques. For example, a printing device could be configured to print the pattern printed at the first printing pass by a first printing technique and to print the pattern to be printed at the second typically non-contact printing pass by a second printing technique. The first printing technique and the second printing technique could be identical or different printing techniques Additional printing passes could use the same or additional printing techniques.

The apparatus includes a substrate support mechanism. The substrate support mechanism is configured to support the substrate and displace it, if desired, in course of the first and the second printing pass. For printing at the second or third or other printing passes, usually non-contact additional printing passes, the substrate support mechanism maintains the substrate in a position identical to the position of the first printing pass. Alternatively, the paste dispensing mechanisms with the corresponding printing devices could be displaced.

The paste dispensing mechanisms dispense the paste in an amount sufficient to form the pattern to be printed. The paste could be an electrically conductive paste and include C, Cu, Ag, and Au particles or a conductive polymer paste. The apparatus prints the pattern at the first printing pass by a first paste and the pattern printed at the second pass by a paste different from the first paste or second paste. The second paste could be different from the first paste in at least one paste property.

The pattern to be printed could include segments and features of different aspect ratio. The segments and features of the pattern could be conductors or tracks conducting electricity and stubs of different cross section such as pyramidal, cylindrical, conical and other cross sections. Each of the features could include multiple paste layers printed at different printing passes with pastes having different properties.

LIST OF FIGURES AND THEIR BRIEF DESCRIPTION

DETAILED DESCRIPTION

The ability to print high aspect ratio patterns and in particular patterns including electrically conductive patterns could support the combination of thinner, higher signal conducting conductors or tracks and thicker electric power supplying conductors or tracks printed on the same substrate. Different components could be mounted or connected to segments with different segment thickness. Segments with different segment thickness could increase the packaging density, improve thermal dissipation, lower electronic circuit assembly costs, reduce the number of interconnections and improve the product reliability.

Figure 1:
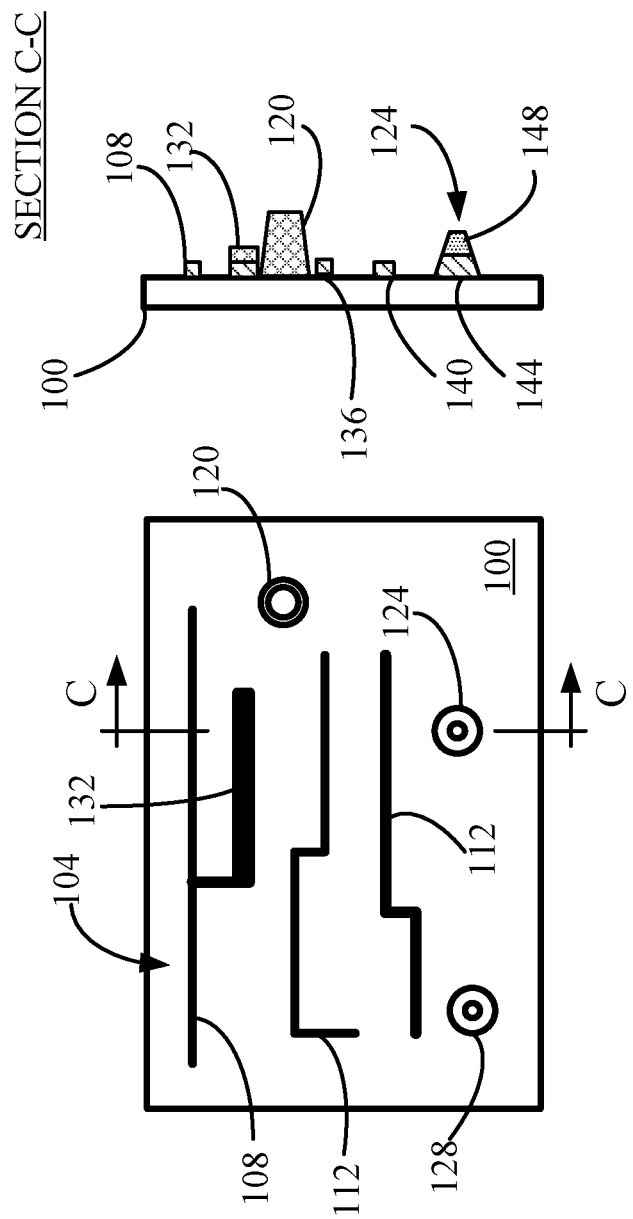
FIG. 1 is a schematic illustration of an example of a substrate with printed on it a pattern including segments of different aspect ratio.

Reference is made to FIG. 1, which is a schematic illustration of an example of a substrate with a printed on it pattern including segments of different aspect ratio. Substrate 100 could include a pattern 104 of conductors or tracks 108, 112 and 116 and a number of pyramidal, conical, cylindrical or other cross section stubs 120, 124 and 128. Each conductor 108, 112, 116 and each stub 120, 124, 128 could be of different aspect ratio or vertical geometry and could include layers of different materials. For example, the conductors could have a width of 20-50 micron and height of 60-150 micron and the stubs could have a diameter of 30-80 micron and height of 60-150 micron.

Substrate 100 could be made from metal, plastic or other material. Substrate 100 could be a rigid or flexible substrate. A segment 132 of conductor 108 and stub 124 could include layers printed by pastes including different materials. For example, layer 136 of conductor 112 could be from a first material and layer 140 of conductor 112 could be from a second material. In a similar way layer 144 of stub 124 could be from a first material and layer 148 could be from a third material. Stub 120 could be deposited or printed entirely from the second material.

Figure 2:
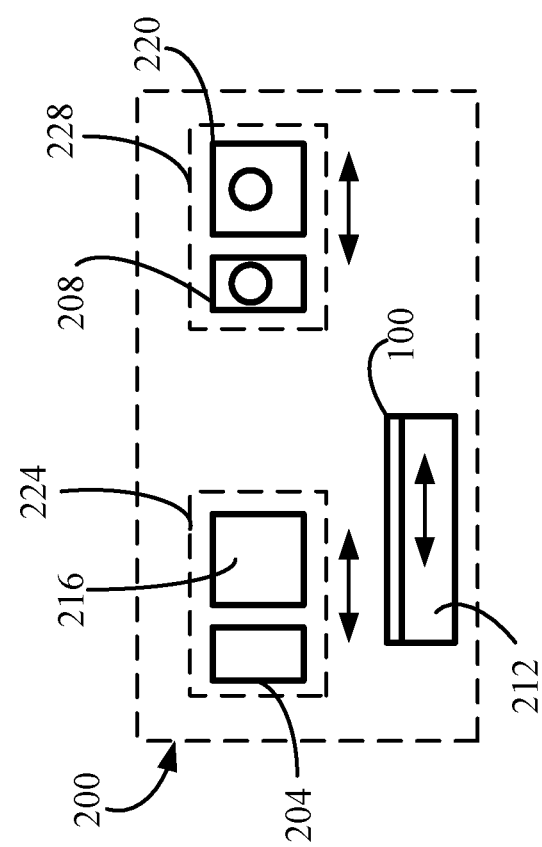
FIG. 2 is a schematic illustration of a printing apparatus according to an example.
Figure 3:
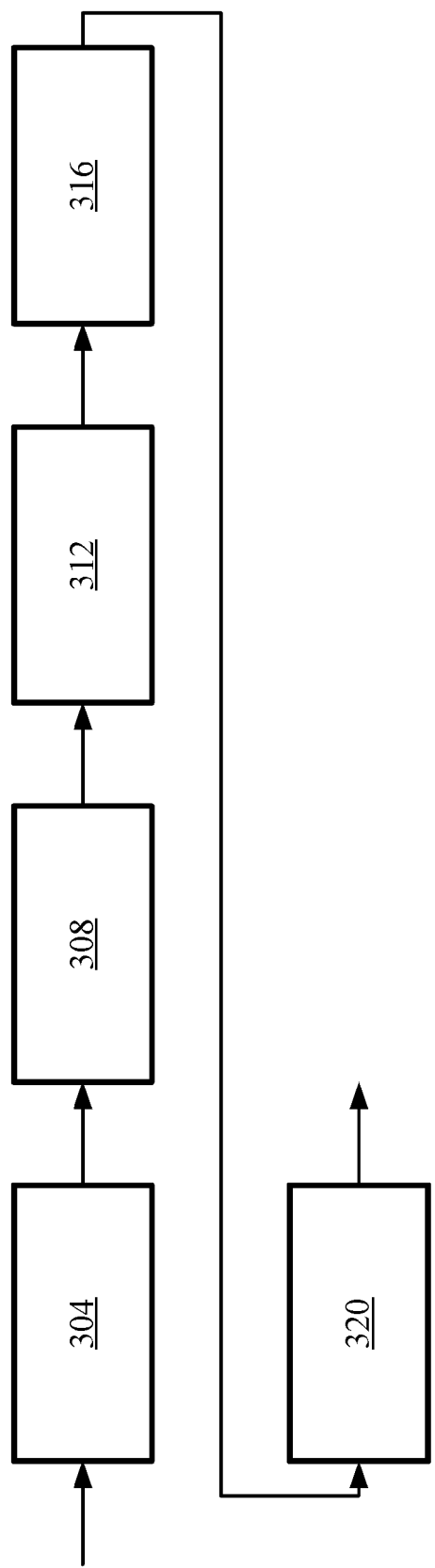
FIG. 3 is a schematic illustration of another example of a printing apparatus.

FIG. 2 is a schematic illustration of a printing apparatus according to an example. Apparatus 200 is configured for printing a high aspect ratio and/or specific vertical geometry patterns and generally prints the high aspect ratio and/or specific vertical geometry patterns in a number of printing passes. Apparatus 200 could use a similar or different printing techniques and mechanisms for each pass. Apparatus 200 includes a paste dispensing mechanism 204 configured to dispense a high viscosity paste to form in a first printing pass a pattern 104 or a different pattern on substrate 100. Apparatus 200 includes an additional paste dispensing mechanism 208 configured to dispense on substrate 100 a paste to at least a segment of pattern 104, for example, segment 132 or stub 124 (FIG. 1) of pattern 104 printed at the first pass to change in a second typically non-contact printing pass the thickness of the segment of the pattern printed at the first pass. A substrate support mechanism 212 is configured to support substrate 100 and displace it, if desired, in course of the first and the second printing pass and the entire printing process. Practically, the height of the conductors and stubs i.e. printed features is a function of the number of printing passes made. Generally, a relatively large number of passes could be made and the different high aspect ratio features could be printed.

Apparatus 200 is configured to print segments of pattern 104 or the entire pattern 104 printed at the first printing pass by a printing device 216 operating or printing according to a first printing technique. The printing technique could be for example, such as screen printing, PTP technique disclosed in U.S. Pat. No. 8,652,872 and US pending patent application No. 2011/0197965 to the same assignee and the same inventor and a modification of the PTP technique, LIFT ((Laser Induced Forward Transfer) or MAPLE (matrix-assisted pulsed laser evaporation) transfer printing techniques. For the second printing pass, substrate support mechanism 212 maintains substrate 100 in a position identical to the position of the first printing pass. In one example, maintenance of substrate 100 in a position identical to the position of the first printing pass could be achieved by displacing support 212 with fixed on it substrate 100 between unit 224 containing paste dispensing mechanism 204 and printing device 216 and unit 228 containing paste dispensing mechanism 208 and printing device 220. In another example, support 212 with fixed on it substrate 100 remains static in course of the first and second printing pass and units 224 and 228 are displaced to print pattern 104. The accuracy of units 224 and 228 displacement and registration between different printing passes could be supported by known in the art methods.

Apparatus 200 is configured to print segments of pattern 104 printed at the second typically non-contact printing pass by a second printing device 220 operating or printing according to a second printing technique. The second printing technique could be for example, such as PTP technique disclosed in U.S. Pat. No. 8,652,872 and US pending patent application No. 2011/0197965 to the same assignee and the same inventor, LIFT or MAPLE transfer printing.

FIG. 2 illustrates the first paste dispensing mechanism 204 and second printing device 216 and paste dispensing mechanism 204 and second printing device 220 being different from each other and accordingly printing employing a first printing technique and a second printing technique, which could be different printing techniques. In some examples the first printing technique and the second printing technique could be identical printing techniques and printing devices 216 and 220 could be identical printing devices.

The paste dispensing mechanism 208 configured to dispense on substrate 100 a paste to at least a segment of the pattern printed at the first pass dispenses the paste to the segment of the pattern earlier printed before the paste printed at the first pass is dry or what is known as "wet-on-wet" printing. The printing pastes used in the current process typically, have a viscosity of 200 cps to 1000 cps and feature minimal slumping between the first printing pass and the second printing pass. Printed tests conducted by the author of the disclosure show that layers of paste deposited or printed at different passes still feature good adhesion between the substrate and the paste layers printed or deposited in successive prints.

Dispensing the paste and printing the pattern in accordance with the wet-on-wet printing technique, facilitates accurate placement of the second and additional paste layers, since thermal processing of the printed layer, for example drying of the paste, would inevitably generate printed pattern distortions and complicate the second printed layer registration. The wet-on-wet printing process is free of this drawback. Registration of the second and additional paste layers is performed through simple movements in X-Y directions of the paste dispensing mechanisms 204 and 208 and printing mechanisms 216, 220 since substrate 100 maintains its fixed position through the whole printing process. Although in some examples, support 112 with substrate 100 is displaced, units 224 and 228 maintain their fixed position.

The paste dispensing mechanism 204 of apparatus 200 is configured to dispense the paste for the first printing pass in amount sufficient to form a pattern with a thickness in the range of 5 to 50 micron and to form a pattern of lines that have a width in the range 10 to 150 micron. Typically, the paste is a conductive paste and it is selected from a group of pastes consisting of C, Cu, Ag, Au and Conductive polymer pastes. In one example, apparatus 200 could print pattern 104 at the first and the second pass by using identical paste. In some examples, apparatus 200 could prints pattern 104 at the first printing pass by a first paste and the whole pattern 104 or some segments of the pattern 104 could be printed at the second typically non-contact pass by a paste different from the first paste or second paste. The second paste could be different from the first paste in at least one property. For example, it could have a different conductive material or different filler.

In one example, apparatus 200 could print at the second usually non-contact printing pass a pattern 104 which is identical to the pattern printed at the first printing pass, i.e. the layout of the conductors and stubs and their width would be identical to the width of the pattern printed at the first printing pass. In another example, apparatus 200 could print at the second printing pass a pattern which is different from the pattern printed at the first printing pass, i.e. the layout of the conductors and stubs and their width could be different from the pattern printed at the first printing pass.

The method of printing a high aspect ratio and/or specific vertical geometry pattern will be described now. Initially, a substrate 100 to be printed upon is provided and mounted on support 212 of printer 200 (Block 304). At the first printing pass, paste dispensing mechanism 204 applies a high viscosity paste to substrate 100 in an amount sufficient to form pattern 104 on substrate 100 (Block 308). Printing device 216 becomes operative (Block 312) to print or form pattern 104 on substrate 100. Printing device 216 could print pattern 104 at the first printing pass by a first printing technique. The first printing technique could be for example, such as screen printing, PTP technique disclosed in U.S. Pat. No. 8,652,872 and US pending patent application No. 2011/0197965 to the same assignee and the same inventor, LIFT or MAPLE transfer printing techniques and their modifications.

Following completion of the first printing pass, paste dispensing mechanism 208 applies a high viscosity paste in an amount sufficient to form a second printing pass (Block 316). Paste dispensing mechanism 208 deposits an additional layer on at least a segment of pattern 104 printed at the first pass, such as to change the thickness of the segment of the pattern printed at the first pass. The change in thickness will increase the aspect ratio of the segment and a higher aspect ratio pattern will be printed. Paste dispensing mechanism 208 applies or dispenses the paste to the segment of the pattern earlier printed, before the paste printed at the first pass becomes dry or what is termed as wet-on-wet" printing technique.

The advantage of using the wet-on-wet printing technique is in that it facilitates accurate placement of the second and additional paste layers, since thermal processing of the printed layer, for example drying of the paste, would inevitably generate printed pattern distortions and complicate the second printed layer registration. The wet-on-wet printing process is free of this drawback. Registration of the second and additional paste layers could be performed, if necessary, through simple movements in X-Y directions of the paste dispensing mechanisms 204 and 208 and printing mechanisms 216, 220 since substrate 100 maintains its fixed position through the whole printing process.

Printing device 220 becomes operative (Block 320) to print or form a high aspect ratio segment 132 (FIG. 1) of pattern 104 on substrate 100. Printing device 220 could print segment 132 of pattern 104 by a printing technique identical to the first pass printing technique or a technique different from the first pass printing technique. The second typically non-contact printing technique could be for example, such as PTP technique disclosed in U.S. Pat. No. 8,652,872 and US pending patent application No. 2011/0197965 to the same assignee and the same inventor or a modification or the PTP technique, LIFT or MAPLE transfer printing techniques or a modification of LIFT and MAPLE transfer printing techniques.

The pattern printed at the first printing pass could have a thickness in the range of 5 to 50 micron and form conductor lines with a width in the range 10 to 150 micron. At the second and further typically non-contact printing passes the printed features could be of identical width or a smaller width, for example, a smaller width could assist to form point like bumps with trapezoidal or conical vertical cross section.

According to the method, different conductive pastes could be used for printing at the first and the second printing passes. These could be pastes consisting of C, Cu, Ag, Au particles and conductive polymer pastes. In one example, the pattern printed at the first and the second pass could be printed by identical paste. In another example, the pattern printed at the first pass is printed by a first paste and the pattern printed at the second pass is printed by a paste different from the first paste or second paste. The second and other pastes used in subsequent printing passes could be different from the first paste in at least one property.

According to the method, the pattern printed at the second printing pass could be identical or at least partially overlap the pattern printed at the first printing pass. According to another example the pattern printed at the second printing pass could be different from the pattern printed at the first printing pass. According to the printing method disclosed the additional printed layer (or plurality of layers) printed at the second or additional printing passes over a segment of the earlier printed pattern change the thickness of the resulting printed pattern and increases the aspect ratio of the printed pattern.

The method and apparatus disclosed support printing of high aspect ratio of different patterns. Optimizing the combination of a number of printing techniques and suitable viscous printing paste supports realization of high-aspect ratio pattern printing. The printing method is "wet on wet" and among others it is facilitated by proper selection paste viscosity to provide minimal slumping between the successive prints. The advantage of the wet-on-wet printing process is in that the registration between successive paste dispensing and printing processes is a simple operation. In spite of multiple printing passes the method supports good adhesion between the different pastes and material printed in successive prints, including printing on "tacky" surfaces with low adhesion.

The method and apparatus support printing at lower costs, along with higher productivity.

The disclosure provided a number of examples of the method and apparatus, however, it should be noted that the method and apparatus can be practiced otherwise than as specifically illustrated and described without departing from the spirit or scope of the claims.

What is claimed is:

1. A method of printing a high aspect ratio and/or specific vertical geometry pattern comprising:

applying in a first printing pass a high viscosity paste to form a pattern on a substrate;

applying in a second non-contact printing pass a high viscosity paste to at least a segment of the pattern printed at the first pass to change thickness of the at least the segment of the pattern printed at the first pass; and wherein applying a paste to at least a segment of the pattern earlier printed is, before applying any thermal process on the paste printed at the first pass.

2. The method according to claim 1, wherein the pattern printed at the first printing pass is printed by a first printing technique.

3. The method according to claim 1, wherein the pattern printed at the second non-contact printing pass is printed by a second printing technique.

4. The method according to claim 3, wherein the first printing technique and the second printing technique are identical printing techniques.

5. The method according to claim 3, wherein at least one of the printing techniques is a modification of LIFT (laser induced forward transfer) printing technique.

6. The method according to claim 3, wherein at least one printing technique is a modification of PTP (Pattern Transfer Printing) technique.

7. The method according to claim 1, wherein the pattern printed at the first printing pass has a thickness in range of 5 to 50 micron.

8. The method according to claim 1, wherein the pattern printed at the first printing pass includes lines (conductors) with a width in range 10 to 150 micron.

9. The method according to claim 1, wherein the pattern includes "point like" bumps.

10. The method according to claim 9, wherein the bumps have a conical shape.

11. The method according to claim 1, wherein the paste is a conductive paste.

12. A method according to claim 11, where the paste is at least one of a group of pastes consisting of C, Cu, Ag, Au and conductive polymer pastes.

13. The method according to claim 1, wherein the pattern printed at the first and the second pass is printed by identical paste.

14. The method according to claim 1, wherein the pattern printed at the first pass is printed by a first paste and the pattern printed at the second pass is printed by a paste different from the first paste (or second paste).

15. The method according to claim 1, wherein a first paste and the paste different from the first paste (second paste) are different in at least one property.

16. The method according to claim 1, wherein the pattern printed at the second printing pass has a width different from the width of the pattern printed at the first printing pass.

17. The method according to claim 1, wherein the pattern printed at the second printing pass has a width identical to the width of the pattern printed at the first printing pass.

18. The method according to claim 1, wherein the pattern printed at the second printing pass at least partially overlaps the pattern printed at the first printing pass.

19. The method according to claim 1, further comprising printing at least one additional layer (a plurality of layers) over at least a segment of the pattern printed at the second printing pass to change thickness of earlier printed layers.

20. The method according to claim 19, wherein the at least one additional layer is printed by one of a group of printing techniques consisting of a printing technique identical to first and second printing technique and a printing technique different from the first and second printing techniques.

21. An apparatus for printing a high aspect ratio and/or specific vertical geometry pattern comprising:

a paste dispensing mechanism configured to dispense a high viscosity paste to form a pattern on a substrate at a first printing pass;

a substrate support mechanism configured to support the substrate;

a mechanism for relative displacement of the substrate and/or the paste dispensing mechanism; and wherein a second printing pass is performed without registration as the substrate support mechanism maintains the substrate in a position identical to the position of the first printing pass, and wherein the paste dispensing mechanism is configured to dispense on the substrate a paste to at least a segment of the pattern printed at the first pass dispenses the paste to at least a segment of the pattern earlier printed before the paste printed at the first pass is dry.

22. An apparatus for printing a high aspect ratio and/or specific vertical geometry pattern comprising:

a paste dispensing mechanism configured to dispense a high viscosity paste to form a pattern on a substrate at a first printing pass;

a substrate support mechanism configured to support the substrate;

a mechanism for relative displacement of the substrate and/or the paste dispensing mechanism; and wherein a second printing pass is performed without registration as the substrate support mechanism maintains the substrate in a position identical to the position of the first printing pass, wherein the apparatus is configured to print the pattern printed at the second printing pass by a second printing technique and wherein the first printing technique and the second printing technique are different printing techniques.

23. An apparatus for printing a high aspect ratio and/or specific vertical geometry pattern comprising:

a paste dispensing mechanism configured to dispense a high viscosity paste to form a pattern on a substrate at a first printing pass;

a substrate support mechanism configured to support the substrate;

a mechanism for relative displacement of the substrate and/or the paste dispensing mechanism; and wherein a second printing pass is performed without registration as the substrate support mechanism maintains the substrate in a position identical to the position of the first printing pass, wherein the apparatus prints the pattern at the first printing pass by a first paste and the pattern printed at the second pass by a paste different from the first paste.

24. The apparatus according to claim 23, wherein the first paste and the second paste are different in at least one paste property.

25. An apparatus for printing a high aspect ratio and/or specific vertical geometry pattern comprising:

a paste dispensing mechanism configured to dispense a high viscosity paste to form a pattern on a substrate at a first printing pass;

a substrate support mechanism configured to support the substrate;

a mechanism for relative displacement of the substrate and/or the paste dispensing mechanism; and wherein a second printing pass is performed without registration as the substrate support mechanism maintains the substrate in a position identical to the position of the first printing pass, and wherein the apparatus prints the pattern at the second printing pass at a width different from the width of the pattern printed at the first printing pass.

26. An apparatus for printing a high aspect ratio and/or specific vertical geometry pattern comprising:

at least one paste dispensing mechanism configured to dispense a high viscosity paste to forma pattern on a substrate at a first and subsequent printing passes; and wherein in order to avoid distortions caused by thermal processing of the paste and the substrate the paste dispensing mechanism dispenses the paste for the subsequent printing passes over the wet paste dispensed at a previous printing pass.

27. The apparatus according to claim 26, further comprising a printing mechanism configured to print the pattern printed at the first printing pass by a first printing technique.

28. The apparatus according to claim 26, further comprising at least one additional printing mechanism configured to print the pattern printed at the subsequent printing passes by a printing technique different from the first printing technique.

29. The apparatus according to claim 26, further comprising:

a substrate support mechanism configured to support the substrate; and a mechanism for relative displacement of the substrate and/or the paste dispensing mechanism.

30. A method for printing a high aspect ratio and/or specific vertical geometry pattern comprising:

providing a substrate and at least one paste dispensing mechanism configured to dispense a high viscosity paste to form a pattern on a substrate at a first and subsequent printing passes; and in order to avoid distortions caused by thermal processing of the paste and the substrate the paste dispensing mechanism dispensing the paste for the subsequent printing passes over the wet paste dispensed at a previous printing pass.

31. The method according to claim 30, further comprising employing a printing mechanism configured to print the pattern printed at the first printing pass by a first printing technique.

32. The apparatus according to claim 30, further comprising employing at least one additional printing mechanism configured to print the pattern printed at the subsequent printing passes by a printing technique different from the first printing technique.

* * * * *